(12) United States Patent
Mitchell et al.

(10) Patent No.: US 6,555,825 B1
(45) Date of Patent: Apr. 29, 2003

(54) ION IMPLANTER

(75) Inventors: Robert John Clifford Mitchell, Pulborough (GB); Keith Relleen, Horsham (GB); Justin Lowe, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/552,697

(22) Filed: Apr. 19, 2000

(30) Foreign Application Priority Data

Apr. 19, 1999 (GB) .............................................. 9908953

(51) Int. Cl.⁷ .............................................. H01J 37/00
(52) U.S. Cl. .................................. 250/398; 250/442.11
(58) Field of Search ........................... 250/398, 442.11, 250/492.2, 453.1, 492.3

(56) References Cited

U.S. PATENT DOCUMENTS

| 5,003,183 A | 3/1991 | Nogami et al. |
| 5,229,615 A | 7/1993 | Brune et al. |
| 5,929,456 A * | 7/1999 | Tamai .................... 250/492.21 |
| 6,092,485 A * | 7/2000 | Ando .................... 118/723 VE |
| 6,313,469 B1 * | 11/2001 | Tamai .................... 250/442.11 |

FOREIGN PATENT DOCUMENTS

| WO | WO 9730467 | 8/1997 |
| WO | WO 9913488 | 3/1999 |

* cited by examiner

*Primary Examiner*—John R. Lee
*Assistant Examiner*—Zia R. Hashmi
(74) *Attorney, Agent, or Firm*—Boult Wade Tennant

(57) ABSTRACT

An ion implanter having a scanning arm which can pass vertically through ion beam, having a wafer loading/unloading position above the beam. The scanning arm also has capability for movement of wafer in its own plane when tilted relative to the beam, and there is also disclosure of a double scanning arm arrangement generating to/from a single wafer loader/unloader.

14 Claims, 4 Drawing Sheets

ION IMPLANTER

FIELD OF THE INVENTION

This invention is concerned with ion implanters and particularly ion implanters intended for processing single wafers one after the other. In particular, the invention is concerned with the handling of such single wafers in the process chamber of the implanter in which implantation takes place.

BACKGROUND OF THE INVENTION

Ion implanters for processing single wafers one after the other are known from for example U.S. Pat. No. 5,229,615. In such single wafer ion implanters, a crucial part of the process is the handling of the wafer in the process chamber, both the way in which the wafer is mechanically scanned for processing, and the way in which a processed wafer is removed from the chamber and a fresh wafer is supplied to the chamber. Usually, during implantation, the wafer is held on a chuck. In many applications, the ion beam used for implantation has a beam cross-section which is much smaller than the area of the wafer and so coverage over the entire wafer surface is ensured by mutually scanning the ion beam and the wafer during processing. For single wafer implanters, it is known for the beam itself to be scanned in one direction across the wafer, e.g. by electrostatic or electromagnetic means, and for the wafer to be mechanically scanned in a direction generally orthogonal to the plane of scanning of the beam. To achieve this mechanical scanning, the chuck carrying the wafer during processing is itself moved to and fro through the plane of the scanned beam.

Commonly, the beam is scanned in a horizontal plane so that the mechanical movement of the chuck carrying the wafer is generally vertical. The above referred U.S. Pat. No. 5,229,615 achieves the vertical scanning of the chuck and wafer by means of a mechanism supporting the chuck from a position horizontally spaced from the scanned beam.

It is also desirable to enable the angle presented by the wafer on the chuck to the scanned beam to be adjustable. This permits the angle of implantation into the wafer to be adjusted. Relatively high implant angles may be desirable, especially for implantation into the sides or walls of trenches, troughs or mesas on a previously processed wafer. It is considered desirable for the mechanism which provides the mechanical scanning action of the chuck and wafer to move the wafer through the beam always along a line in the plane of the wafer, irrespective of the angle of tilt of the wafer for the purpose of providing an angled implant. Such an arrangement is provided, for example, by WO 99/13488.

Mechanisms which support the wafer and chuck for mechanical scanning from one side of the beam (at a horizontally spaced position relative to the beam, assuming the beam is itself scanned in a horizontal plane) can more readily provide the desirable mechanical scanning action of the wafer, always in the plane of the wafer, as the wafer is tilted to different implant angles. In the case of U.S. Pat. No. 5,229,615 and WO 99/13488, this scanning action is provided by mounting a linear scanning mechanism on a structure which can as a whole be rotated about an axis generally parallel to the plane of the scanned beam and through the plane of the wafer. Then, adjustment of the rotary position of the scanning mechanism about this axis tilts the wafer to desired implant angle and also ensures subsequent mechanical scanning of the wafer is then along a line in the plane of the wafer at the new tilt angle.

It is also highly desirable for the chuck supporting the wafer during scanning to be orientated in a generally horizontal position for unloading a processed wafer and loading a new wafer. Then a new wafer can be initially supported on the chuck by the action of gravity. It will be understood that wafer handling within the process chamber is typically performed by means of a robot arm which can place a wafer over a horizontally orientated chuck and then release it, and conversely grip a processed wafer on a chuck and then remove it.

In each of U.S. Pat. No. 5,229,615 and WO 99/13488, the chuck can be rendered horizontal by rotating the tilt mechanism of the mechanical scanning arrangement through 90°. In this position, the chuck and wafer holder is invariably in the plane of the scanned beam and so the beam is interrupted for loading and unloading.

U.S. Pat. No. 5,003,183 discloses a further single wafer scanning arrangement in which the wafer holder is brought to a horizontal orientation for loading and unloading, in a position in the plane of the scanned beam, but to one side clear of the beam path. In this way loading and unloading can proceed without interrupting the beam, so that a second scanning mechanism may then be included to implant a second wafer while the first wafer is being removed or replaced. This allows almost continuous implanting without interruptions for loading and unloading. However, because the loading/unloading positions are to the side of the scanned beam, the process chamber must be relatively wide. Also separate wafer handling stations are required for the scanning mechanisms on opposite sides of the beam.

SUMMARY OF THE INVENTION

It is an objective of the present invention to provide a single wafer ion implanter in which loading and unloading of the wafer holder can be preferred out of the line of the ion beam.

The present invention provides, in one aspect, an ion implanter for serially processing single wafers comprising a vacuum chamber, a substrate holder in the vacuum chamber, an ion beam generator for generating a beam of ions to be implanted, a beam scanner for scanning the beam in a horizontal plane across a target substrate on the holder, and a scanning mechanism comprising an arm having an inner end carrying the substrate holder and an arm actuator horizontally spaced from the scanned beam, said scanning mechanism being operative to scan the substrate holder in a generally vertical direction through the plane of the beam for implantation of a wafer, and having a loading and unloading position in which the substrate holder supports a substrate in a substantially horizontal orientation at a position above the plane of the beam.

In an implanter according to the present invention it is preferred that the substrate holder is mounted for rotation about a first axis to move between the loading and unloading position and a position in which a substrate provided thereon is located in the path of the beam, the substrate holder being mounted for rotation about the first axis to locate the substrate in the path of the beam upstream of the first axis.

In an implanter according to the present invention the scanning mechanism may further comprise a rotatable hub on which the arm is rotatably mounted, the arm being mounted on the hub for rotation about the second axis, and the hub being mounted for rotation about the first axis which is normal or substantially so to the second axis. The arm is preferably movable in a plane which is parallel to and spaced from the second axis and preferably forwardly of the second axis, so that, as the hub is rotated about its first axis to carry the substrate holder out of the path of the ion beam, the rotation thereof causes the substrate holder to be moved above the plane of the beam as desired. The first and second axes may be coplanar.

The hub may be mounted at least partially within the wall of the vacuum chamber in airtight relationship therewith.

In an ion implanter according to the present invention, two substrate holders, each mounted on a respective scanning mechanism, may be arranged in face to face relationship such that each substrate holder can be moved between the loading and unloading position as aforesaid and a second position in which a substrate located on a respective substrate holder can be scanned in the generally vertical direction through the plane of the beam. Each arm may be movable to move the substrate holder to the same loading and unloading position such that, while one substrate holder is in that position, the second substrate holder is being scanned through the plane of the beam, and the positions of the two substrate holders can be interchanged without coming into contact with one another. Preferably, the two hubs are coaxially mounted.

The, or each, hub may be rotatable about its axis of rotation so that the, or each, substrate holder can be presented at a tilt angle to a beam of ions directed at a substrate mounted on the substrate holder. Preferably the, or each, arm is rotatable about its axis of rotation so that the, or each, substrate holder can be swept at its respective tilt angle through the beam of ions. The, or each, substrate holder can be controllably rotated through any angle about its axis of rotation while at a selected respective tilt angle.

In an implanter according to the present invention, the, or each, hub may provide a mounting platform which is spaced from and parallel to the axis of rotation of the hub and the respective arm is mounted for rotation thereon about its axis of rotation. The, or each, hub may be mounted in the wall of the vacuum chamber for rotation about its axis and in airtight relationship with the wall of the vacuum chamber.

The present invention further provides an ion implanter comprising a vacuum chamber, first and second substrate holder assemblies mounted in the vacuum chamber, an ion beam generator for directing a beam of ions at a substrate target when presented in the path of the beam, and each substrate holder assembly comprising a substrate holder and an arm associated with each substrate holder and mounted for movement in the vacuum chamber to move a first one of the substrate holders between a first position in which the substrate holder is positioned in the path of the beam to permit ion implantation in a target substrate mounted on that substrate holder and a second position in which the substrate holder is positioned for loading or removal of a target substrate from the substrate holder while the second one of the substrate holders is being moved in the opposite direction between the first position and the second position.

The second position is preferably located above the path of the beam.

The first and second substrate holder assemblies are preferably mounted in face to face relationship within the vacuum chamber.

Preferably each arm is mounted on a respective rotatable hub and the axes of rotation of the two hubs are co-linear, each arm being mounted for rotation on its respective hub in a manner such that it can be moved, when a substrate holder is being moved between its first position and its second position, and will not obstruct the movement in the opposite direction of the other substrate holder.

The present invention further provides an ion implanter comprising a vacuum chamber, a substrate holder in the vacuum chamber, an ion beam generator for directing a beam of ions at a substrate target mounted on the substrate holder, and a hub located in the wall of the vacuum chamber and rotatable about a first axis in the path of the beam, an arm mounted on the hub for rotation about a second axis normal to the first axis and the substrate holder being mounted on the arm for rotation about a third axis normal to the first axis, the construction and arrangement of the assembly of the substrate holder, the arm and the hub permitting movement of the substrate holder between a first position in which the substrate holder can be positioned in the path of the beam at any desired angle of tilt to the path and forward of the third axis, and a second position in which the substrate holder is positioned above the beam for loading or removal of a target substrate from the substrate holder. Loading or removal of a target substrate at a position above the beam enables the implanter to continue to operate without the necessity to shut off the beam or interpose a shutter between the beam and the target substrate.

There now follows a detailed description of an ion implanter according to the present invention which has been selected for description to illustrate the invention by way of example only and not by way of limitation.

Figure 1:
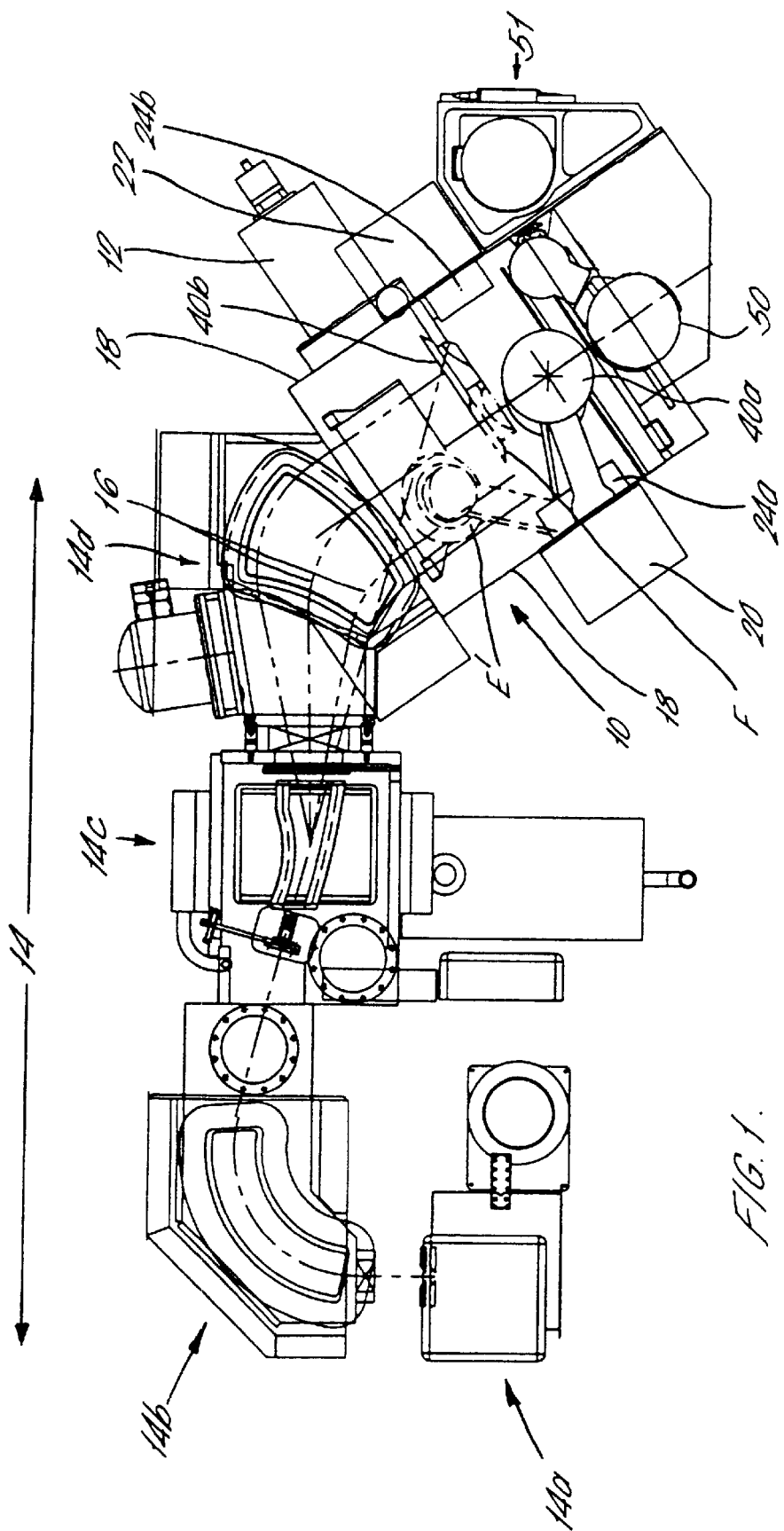
FIG. 1 is a generally diagrammatic plan view, with part removed, of an ion implanter according to the present invention.

In FIG. 1, there is shown an ion implanter which comprises a vacuum chamber generally indicated at 10 and defined by walls 18; the vacuum chamber has an associated vacuum pump 12. The implanter also comprises an ion beam generator generally indicated at 14 and itself comprising an ion source generally indicated at 14a, a mass analyser generally indicated at 14b, a scanning system generally indicated at 14c and a beam collimator generally indicated at 14d. The ion beam generator can, during its operation, deliver a beam of ions, indicated schematically by dotted lines 16, to a substrate mounted on a substrate-holder assembly as described below. The pump 12 and generator 14 will not be further described herein.

Figure 2:
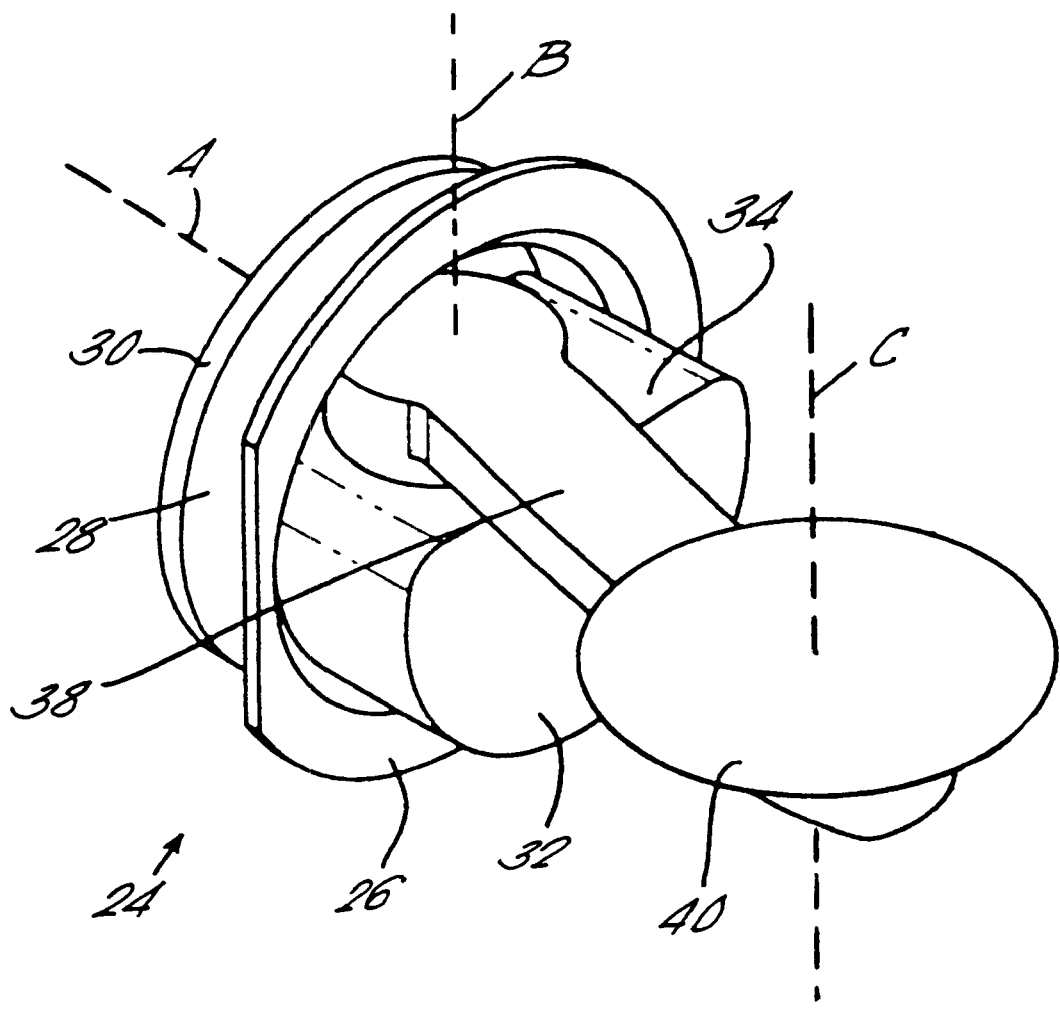
FIG. 2 is an isometric diagrammatic view of a single substrate-holder assembly of the implanter illustrated in FIG. 1.

Referring now to FIG. 2, there is shown a substrate-holder assembly for use in an ion implanter according to the present invention. This substrate-holder assembly comprises a scanning mechanism itself comprising motorised hub unit 24 which is mounted in a wall of a vacuum chamber of an ion implanter as is hereinafter described. The hub unit 24 is intended to be mounted in gas-tight sealed engagement in an aperture in a wall of the vacuum chamber so that it can rotate about an axis A under the control of a servo motor which can closely control the degree of rotation of the hub unit. The axis is, when the hub unit is mounted in the vacuum chamber, aligned with the path of the ion beam of the implanter and transverse to the path of the beam.

The hub unit 24 comprises a flange 26 whereby the hub unit can be located and secured against the wall 18 of the vacuum chamber 10. The flange has an annular extension providing a sleeve 28 which seats snugly in the aperture in the wall 18 and is designed to support a rotatable plate 30 which is integrally formed with a hub 32, the hub 32 itself being supported for rotation in bearings (not shown) within the sleeve 28. The hub is of substantially semicircular or D-shaped cross-section when viewed axially, and is integrally formed with an annular external rim portion of the plate 30, the remaining part of the plate being open to permit access therethrough from the exterior of the vacuum chamber to the interior, for such times as access is required for maintenance or repair.

The hub 32 provides a flat surface 34 which serves as a platform on which is rotatably mounted a hollow arm 38 of the scanning mechanism. The arm 38 has mounted thereon a substrate holder 40.

The arm 38 is mounted for rotation about an axis B, and can be pivoted through an angle between the position shown in FIG. 2 and a position (not shown) to the right thereof through an angle of 90 degrees or more. The arm is rotated by coupling through a gear transmission to a motor mounted within the housing 20. The rotation of the arm 38 may be synchronised with rotation of the hub so that it is caused to adopt any one of several predetermined positions controlled by the rotation of the hub itself, or it may be independent thereof and remotely controlled electronically.

The substrate holder 40 is also mounted for rotation on its arm 38 about an axis C which is parallel to the axis B. The substrate holder 40 can be rotated to any desired extent by a drive transmission which extends along the interior of the arm 38. The drive transmission may comprise a chain and sprocket or a belt drive arrangement extending along the interior of the arm.

The construction and arrangement of the substrate holder assembly is such that, as can be seen from FIG. 2, when the holder is in the horizontal position, it is above the axis A and therefore above the path of the beam. This has particular significance because, in the horizontal position, the substrate holder can be loaded and unloaded without any undesired effects due to the presence of the beam. At the same time, the hub unit can be rotated through 90 degrees to convey the substrate holder and a substrate thereon into the path of the beam.

Additional features of the substrate holder assembly will be described below with reference to FIGS. 1 and 3 which show first and second substrate holder assemblies in face-to-face relationship for use in an implanter according to the present invention. The two assemblies are identical to that shown in FIG. 2 and like parts will be referred to by the same reference numerals as are used in FIG. 2 but with the suffices a and b.

The hub units 24a and 24b of the two assemblies are mounted in apertures (not shown) in opposed walls 18 of the vacuum chamber and are enclosed in housings 20, 22 that are mounted in airtight manner, one on each wall 18. The two hub units are identical, and are coaxially mounted on the axis A. The hub units 24a and 24b are mounted to be rotated during the operation of the implanter, as hereinafter described and are coupled to respective stepper motors (not shown) providing for precision control of rotation of the respective hub units 24a and 24b about the axis A.

Each arm 38a, 38b is mounted for rotation about its own axis B, and can be moved, as shown in FIG. 2 for the arm 38b, between a position as shown at D at one limit of pivotal movement and a position E at the other limit of pivotal movement, as described below. Each arm is rotated by coupling through a gear transmission to the respective motor mounted within the housing 20, 22. As stated above, each substrate holder 40a, 40b is also mounted for rotation on its arm 38a, 38b about an axis C which is parallel to the axis B. The substrate holder 40a, 40b can be rotated to any desired extent by a drive transmission which extends along the interior of the arm 38a, 38b.

Figure 3:
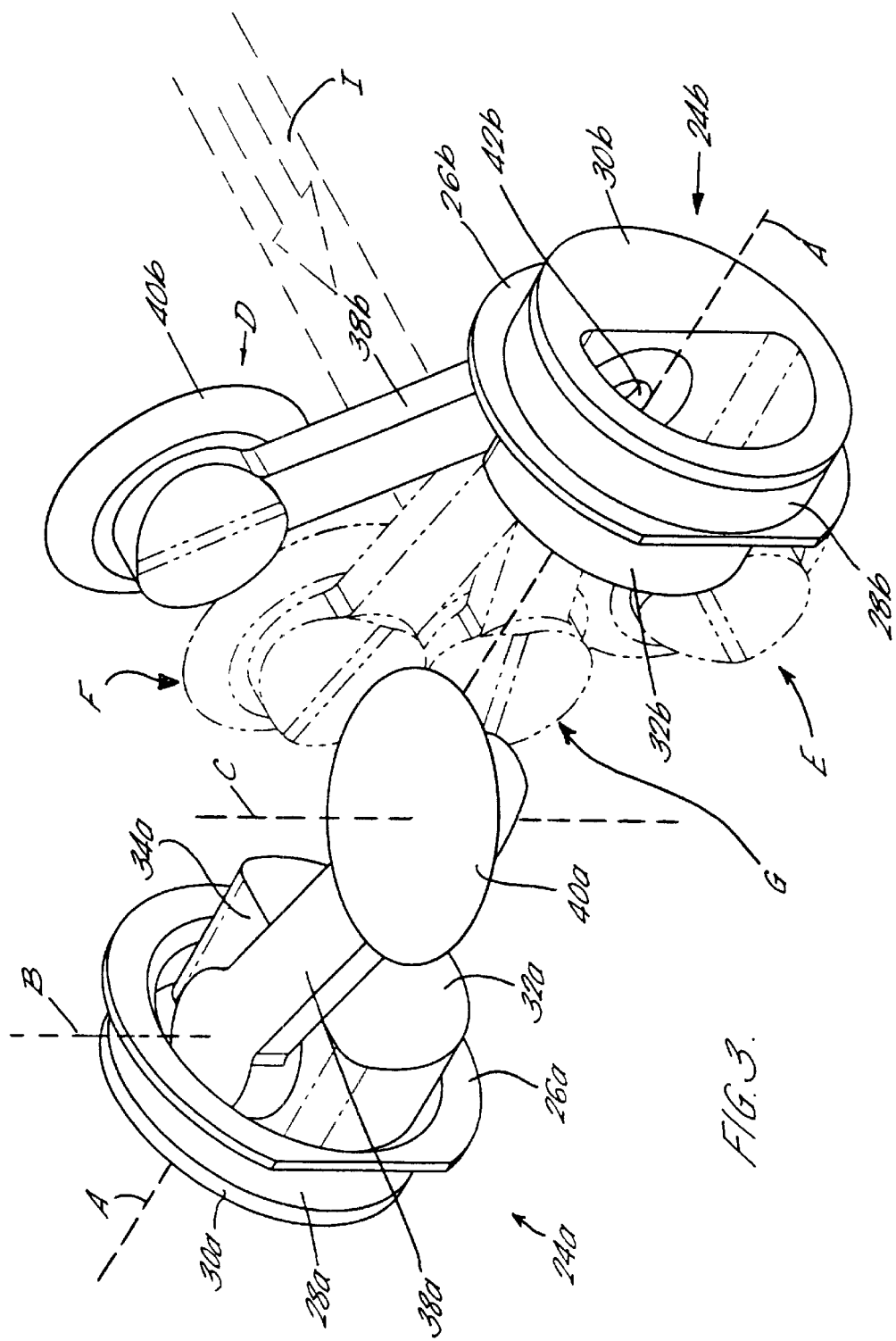
FIG. 3 is a view similar to FIG. 2 showing two substrate-holder assemblies in face-to-face relationship for an ion implanter according to the present invention.

Referring to FIG. 3, the substrate holder 40a is shown in a horizontal attitude in which its platen or substrate receiving surface is positioned to receive a substrate thereon. It will be observed that the holder 40a is also positioned so that it is substantially to one side of a vertical plane which includes the axis A and is also positioned above the horizontal plane including the axis A, and therefore above the path I of the ion beam. In this position, a substrate, in the form of a semiconductor wafer can be loaded onto the platen and secured electrostatically thereto, while the second substrate holder with a substrate mounted thereon is positioned in a vertical attitude and can be moved, as shown in dotted outline, from the position D down through lower positions F (shown also in FIG. 1) and G to the lowermost limit position E. The substrate holder can be held in the path I of the ion beam at position G or can traverse the ion beam as desired, from position F to position E and then reverse its direction of traverse.

In the attitude shown in FIG. 3, the hub unit 24b has been rotated clockwise through 90° from its horizontal position so that the axis of rotation B of the arm 38b lies horizontally in the same plane as the axis A. In this position, the substrate on the holder 40b will be normal to the direction of the beam path I and positioned forward of the axis A, and ions in the beam will impact the substrate at right angles to its surface for as long as the substrate is in the path of the beam.

If, however, it is desired to implant ions at a tilt angle so that ions can be implanted into the side walls of trenches, troughs or mesas previously formed by etching in the substrate, the substrate holder can be held at position F or E for example, and the hub unit rotated about the axis A to move the substrate holder by rotation into the path I of the ion beam so that the substrate holder, and the substrate thereon, are rotated into the beam path and held at a tilt angle relative to the beam path. If any other tilt angle is desired then the hub unit can be rotated accordingly so that the surface 34a, 34b is at the required tilt angle. The hub 32b can be tilted clockwise or anti-clockwise about the axis A so that lower and upper side walls of etched trenches, troughs or mesas can be implanted. Additionally, when at a tilt angle, the substrate holder can be caused to traverse back and forth through the path I of the beam as many times as desired, or can be held stationary in the path of the beam. Alternatively, or in addition, the beam can itself be caused to scan a substrate held in its path.

Figure 4:
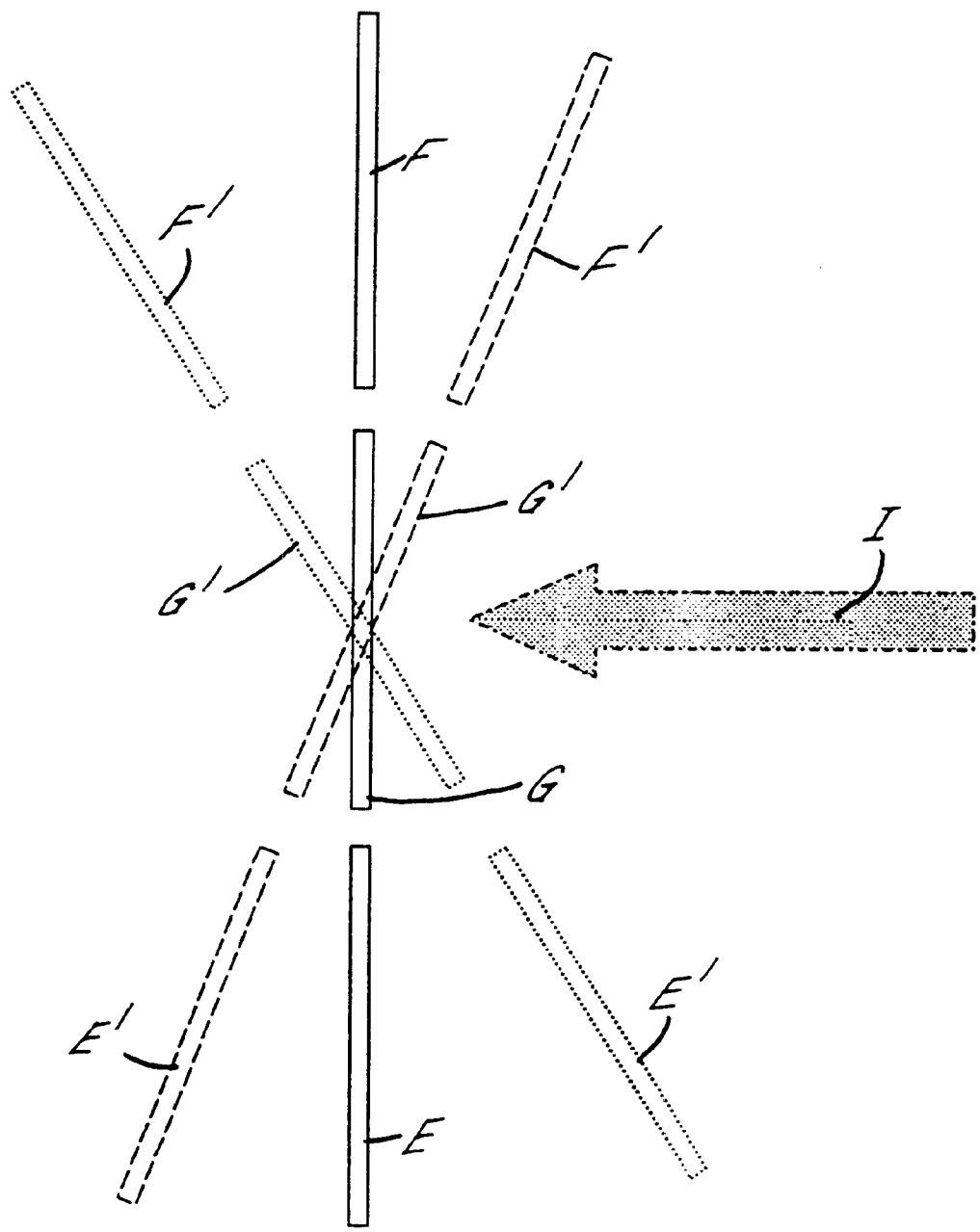
FIG. 4 is a schematic diagram illustrating attitudes of movement of a substrate holder in an ion implant according to the present invention.

All of the side walls can be treated without retrieving the substrate from the implanter while the substrate remains in the vacuum chamber. To achieve this, the substrate holder can simply be rotated about its axis C, or can firstly be moved, as shown in FIG. 4, to position F' or E'. The substrate holder is then rotated through the desired angle about its axis of rotation C, and then the arm rotated downwardly or upwardly to move the substrate holder to position G' in the path of the ion beam, with the substrate holder held at a tilt angle to the beam. In FIG. 1 position E' is illustrated in dotted outline for the wafer holder 40a.

Each substrate holder 40a, 40b is, as stated above with reference to FIG. 2, mounted for rotation about its respective axis C so that, when a substrate, mounted on its respective holder, is scanned by the ion beam, the substrate can maintain the same twist orientation relative to the beam.

To change over one substrate, which has been implanted with ions from the ion beam, for a 'new' substrate, the new or unimplanted substrate is placed on the substrate holder 40a in its horizontal position as shown in FIG. 2, while the other substrate holder 40b is in the path I of the ion beam. To change over the substrate holders, the arm 38a is rotated or swung about its axis B to move the substrate holder from the position shown in FIG. 2 towards the right to the opposite limit of its movement in which position, the holder 40a is above the holder 40b. When the arm and substrate holder have been moved to that position it remains there until such time as implantation of the wafer 40b has been completed. Then, the hub 32b is rotated in an anti-clockwise direction (viewing FIG. 2) to rotate the arm 38b and its substrate holder 40b through 90° until the substrate holder is horizontal. In the horizontal position, the arm 38b is then rotated about its axis B to move the substrate holder to the position previously occupied by the substrate holder 40a so that the substrate thereon can be removed and a further substrate placed thereon.

The substrate holder 40a is then rotated by rotation of the hub 32b through 90 degrees and rotation of the arm 38a about its axis B until the substrate holder is brought into the path of the beam.

The reverse procedure is undertaken when it is desired to change over the substrate holders again. In this manner, a continuous process of implantation, removal and replacement of substrates can be achieved using not only a single implantation location but also requiring only a single loading and unloading position, which is between the two scanning mechanisms and substantially at the position of the substrate holder 40 in FIG. 2, 40a in FIGS. 1 and 3. In FIG. 1, the substrate holder 40a is shown in juxtaposition with a wafer handler 50 of the ion implanter, the wafer handler 50 being arranged to transfer a substrate, delivered thereto through an air lock, or load lock 51, to the substrate holder 40a, as shown. The substrate holder 40a is then moved from this position as described above to move the substrate thereon onto the path of the beam 16 and to permit the substrate holder 40b to move to the position previously occupied by the substrate holder 40a, so that a treated substrate on the holder 40b can be removed and replaced by a fresh substrate.

It will be appreciated by those conversant with the art of ion implantation that where used herein, the terms "horizontal" and "vertical" are relative and that, provided that the relative orientations of the axes referred to are maintained, other attitudes than horizontal and vertical may be adopted, and are to be considered as falling with the scope of the claims.

What is claimed is:

1. An ion implanter for serially processing single wafers comprising
   a vacuum chamber,
   a substrate holder in the vacuum chamber,
   an ion beam generator for generating a beam of ions to be implanted,
   a beam scanner for scanning the beam in a horizontal plane across a target substrate on the holder, and
   a scanning mechanism comprising an arm having an inner end carrying the substrate holder and an arm actuator horizontally spaced from the scanned beam,
   said scanning mechanism being operative to scan the substrate holder in a generally vertical direction through the plane of the beam for implantation of a wafer, and having a loading and unloading position in which the substrate holder supports a substrate in a substantially horizontal orientation at a position above the plane of the beam.

2. An ion implanter according to claim 1 wherein the substrate holder is mounted for rotation about a first axis to move between the loading and unloading position and a position in which a substrate provided thereon is located in the path of the beam, the substrate holder being mounted for rotation about the first axis to locate the substrate in the path of the beam upstream of the first axis.

3. An ion implanter according to claim 2, wherein the scanning mechanism comprises a rotatable hub on which the arm is rotatably mounted, the arm being mounted on the hub for rotation about the second axis, and the hub being mounted for rotation about the first axis which is normal or substantially so to the second axis.

4. An ion implanter according to claim 3, wherein the arm is movable in a plane which is parallel to and spaced from the first axis.

5. An ion implanter according to claim 3, wherein the first and second axes are coplanar.

6. An ion implanter according to claim 3, wherein the hub is mounted at least partially within the vacuum chamber.

7. An ion implanter according to claim 1, wherein the ion implanter comprises two substrate holders, each mounted on a respective scanning mechanism and arranged in face to face relationship such that the substrate holder of each can be moved between the loading and unloading position as aforesaid and a position in which a substrate located on a respective substrate holder can be scanned in the generally vertical direction through the plane of the beam.

8. An ion implanter according to claim 7, wherein each arm is movable to move the substrate holder to the same loading and unloading position such that, while one substrate holder is in that position, the second substrate holder is being scanned through the plane of the beam, and the positions of the two substrate holders can be interchanged without coming into contact with one another.

9. An ion implanter according to claim 7, wherein the two hubs are coaxially mounted.

10. An ion implanter according to claim 3, wherein the, or each, hub is rotatable about its axis of rotation so that the, or each, substrate holder can be presented at a tilt angle to a beam of ions directed at a substrate mounted on the substrate holder.

11. An ion implanter according to claim 10, wherein the, or each, arm is rotatable about its axis of rotation so that the, or each, substrate holder can be swept at its respective tilt angle through the beam of ions.

12. An ion implanter according to claim 10, wherein the, or each, substrate holder can be controllably rotated through any angle about its axis of rotation while at a selected respective tilt angle.

13. An ion implanter according to claim 3, wherein the, or each, hub provides a mounting platform which is spaced from and parallel to the axis of rotation of the hub and the respective arm is mounted for rotation thereon about its axis of rotation.

14. An ion implanter according to claim 1, wherein the, or each, hub is mounted in the wall of the vacuum chamber for rotation about its axis and in airtight relationship with the wall of the vacuum chamber.

* * * * *